(12) United States Patent  (10) Patent No.: US 7,842,897 B2
Miyahara et al.  (45) Date of Patent: Nov. 30, 2010

(54) BONDING APPARATUS (75) Inventors: Toshimichi Miyahara, Tachikawa (JP); Yuu To, Fussa (JP); You Kawamoto, Oume (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 1086 days.

(21) Appl. No.: 11/317,276

(22) Filed: Dec. 23, 2005

(65) Prior Publication Data

US 2006/0186839 A1 Aug. 24, 2006

(30) Foreign Application Priority Data

Dec. 27, 2004 (JP) ............... 2004-377541

(51) Int. Cl.
B23K 20/10 (2006.01)
(52) U.S. Cl. ................... 219/56.21; 228/4.5; 228/179.1
(58) Field of Classification Search ............... 219/56.21, 219/56.22, 481–519, 56; 73/588, 582; 228/103, 228/1.1, 110.1, 108.5, 102, 8, 4.5; 318/34
See application file for complete search history.

(56) References Cited

U.S. PATENT DOCUMENTS 3,283,577 A * 11/1966 Schuck ............... 73/304 R
5,110,032 A * 5/1992 Akiyama et al. ............ 228/102
5,468,927 A * 11/1995 Terakado ............... 219/56.21
5,889,210 A * 3/1999 Inoue ............... 73/588
6,750,734 B2 * 6/2004 Utsunomiya et al. ....... 333/17.1

FOREIGN PATENT DOCUMENTS

JP 9-213752 8/1997
JP 11176868 A * 7/1999

OTHER PUBLICATIONS

Chapter 3.2 of Book "Application-Specific Integrated Circuits" (ISBN: 0201500221) by Smith, Michael John Sebastian, published by Addison-Wesley Longman Inc.*

* cited by examiner

Primary Examiner—Tu B Hoang
Assistant Examiner—Jianying Atkisson
(74) Attorney, Agent, or Firm—H. Henry Koda; William L. Androlia (57) ABSTRACT A wire bonding apparatus including a joining machine unit for joining a wire to a subject device, a measurement unit for measuring the connection state between the subject device and the wire, and a control unit for controlling the operation of the entire apparatus. An AC-C measurement circuit of the measurement unit includes an AC power supply, an equivalent capacitance circuit that creates an essentially the same capacitance as the capacitance component of the joining machine unit before bonding, a differential circuit that finds the difference between the capacitance of the joining machine unit after bonding and the capacitance of the equivalent capacitance circuit, an amplification circuit, a rectification circuit, an AID conversion circuit, a judgment unit that judges the connection state, and an output unit.

19 Claims, 8 Drawing Sheets

BONDING APPARATUS

BACKGROUND OF THE INVENTION

1. Field of the Invention

The present invention relates to a bonding apparatus and more particularly to a bonding apparatus that includes a stage that supports a subject device and is grounded, a joining machine unit that joins a wire to the subject device, and a measurement unit that measures the connection state between the subject device and the wire.

2. Description of the Related Art

In a wire bonding apparatus used in assembling electronic components, a wire such as a slender gold wire is transported by a capillary to the bonding pad of a semiconductor chip supported on, for example, a bonding stage and bonded. The bonded wire is extended and is again bonded at the bonding lead of a circuit board, etc., thereby connecting the bonding pad of the semiconductor chip and the bonding lead of the circuit board. If bonding between the wire and the bonding pad or bonding lead does not go well, a connection defect known as so-called non-adhesion occurs.

In wire bonding, the bonding stage is usually metal, and the item to be bonded is supported this metal bonding stage. For example, if the item to be bonded is a semiconductor chip that includes transistors or diodes, the wire is connected to the electrode of the semiconductor chip with a resistance component, which corresponds to the characteristics of the semiconductor chip, between that electrode and the back of the semiconductor chip. Therefore, in order to detect non-adhesion, an appropriate direct-current current is inputted to the semiconductor chip from the wire, the flowing current value is measured, and the connection defect is judged electrically.

In the bonding apparatus disclosed in Japanese Patent Application Laid-Open (Kokai) No. H9-213752, an electrical path that extends from the side of a bonding arm that supports a capillary to the bonding stage is included in one side of an alternating-current bridge circuit that receives an alternating-current signal from an alternating-current signal generator, and non-adhesion between the wire and the bonded component is detected by detecting equilibrium or non-equilibrium of the alternating-current bridge circuit. In this method, non-adhesion even for a bonded component that has a capacitance component can be detected. The elements on three sides of this alternating-current bridge circuit are a fixed capacitance and a variable resistance and a fixed resistance; and the remaining one side is the impedance between the bonding arm side and the bonding stage. The initial equilibrium of the alternating-current bridge is found by adjusting the variable resistance to a state where there is no connection between the component to be bonded and the wire.

In some cases, the item to be wire bonded has no electrical conductance between the bonding stage. For example, in the case of a glass epoxy circuit board where a chip is mounted with die bonding, the board itself is an insulator. Therefore, the chip upon it is supported by the bonding stage with an insulator interposed. Also, a BGA (ball grid array) board too is a glass epoxy or ceramic material. In these cases, even if a capacitance component is not included between the back of the chip and the bonding pad, the electrical path from the bonding arm side to the bonding stage does not have direct current conduction.

In view of the above, it is preferable to measure using an alternating-current signal, as described in the above-described Japanese Patent Application Laid-Open (Kokai) No. H9-213752. However, measuring with an alternating-current signal in this system combines the capacitance of the mechanism that joins the wire to the subject device (when this is called a joining machine unit, the capacitance component of a joining machine unit) and the device-side capacitance, including the insulating substrate and the subject device. Therefore, when the capacitance component of a joining machine unit is large, the amount of change due to wire adhesion/non-adhesion is buried, and detection becomes difficult.

In Japanese Patent Application Laid-Open (Kokai) No. H9-213752, the capacitance component of the electrical path, which extends from the bonding arm of the bonding apparatus to the bonding stage, which is the capacitance component of the joining machine unit, could be compensated by adjusting the variable resistance. Of course, in this method also, it is possible in principle to find the equilibrium of the alternating-current bridge; but in practice, the capacitance component of the electrical path that extends from the bonding arm of the bonding apparatus to the bonding stage is not compensated, so that it is sometimes difficult to detect adhesion according to the minute changes in the capacitance component.

BRIEF SUMMARY OF THE INVENTION

The object of the present invention is to provide a bonding apparatus that can compensate the capacitance component of the joining machine unit with good precision, and that can measure the connection state between the wire and the subject device with good precision.

The above object is accomplished by a unique structure of the present invention for a bonding apparatus which includes a stage that supports a subject device and is grounded, a joining machine unit that joins a wire to the subject device, and a measurement unit that measures the connection state between the subject device and the wire; and in the present invention, the measurement unit comprises:

an equivalent capacitance circuit that is an equivalent circuit which compensates the capacitance component of the joining machine unit in order to measure the connection state between the wire and a subject device that does not have conductance with the stage, the equivalent capacitance circuit having capacitance substantially equivalent to the machine capacitance component between the joining machine unit and the stage when the wire is not in contact with the subject device;

an alternating-current signal source that supplies an alternating-current signal to the equivalent capacitance circuit and the joining machine unit, respectively;

a capacitance comparison circuit that compares the impedance of the joining machine unit when the wire is joined to the subject device and the impedance of the equivalent capacitance circuit; and a judgment unit that judges the connection state between the wire and the subject device based on the output of the capacitance comparison circuit.

In the above structure of the present invention, it is preferable that the equivalent capacitance circuit comprise:

a plurality of capacitance elements;

a plurality of switch elements that are interconnected to the plurality of capacitance elements and generate a plurality of capacitance values that are mutually different according to a manner of connection; and a switch switching circuit that controls the on/off state of each one of the switch elements and generates a capacitance value substantially equivalent to the machine capacitance component.

In addition, it is preferable to design the switch switching circuit so that it switch each one of the switch elements so as to minimize the output of the capacitance comparison circuit when the wire is not in contact with the subject device.

It is further preferable that:
each one of the capacitance elements have a capacitance value that is 2%-50% of the value of the machine capacitance component, and
each one of the switch elements have a capacitance value that is 2%-50% of the value of the capacitance in the capacitance element having at least capacitance.

In addition, in the bonding apparatus of the present invention, the judgment unit can be comprised of an averaging processing means that averages the output of the capacitance comparison circuit at an arbitrary sampling interval and makes outputs thereof.

Furthermore, the judgment unit can be comprised of a judgment processing means that judges the contact state between the wire and the subject device with reference to an arbitrarily set threshold value in relation to the averaged output.

In addition, it is preferable that the judgment processing means be designed so as to update the threshold value in accordance with repetition of joining operations between the wire and the subject device and that the judgment processing means be able to set different threshold values according to the type of subject device.

Furthermore, in the bonding apparatus of the present invention,
the equivalent circuit can be comprised of a plurality of capacitance elements; a plurality of switch elements that are interconnected to the plurality of capacitance elements and generate a plurality of capacitance values that are mutually different according to a manner of connection; and a switch switching circuit which is a circuit that controls the on/off state of each one of the switch elements and generates a capacitance value substantially equivalent to the machine capacitance component, the switch switching circuit switching each one of the switch elements so as to minimize the output of the capacitance comparison circuit when the wire is not in contact with the subject device; and
the judgment processing means can be designed so that it sets as the threshold value a value corresponding to the output of the capacitance comparison circuit when the out has been minimized by the switch switching means.

Furthermore, the judgment processing means can be designed so as to judge whether or not it is possible to detect adhesion/non-adhesion of the subject device, to judge adhesion/non-adhesion between the wire and the subject device, and to judge if the length of the wire tail is appropriate or not.

Furthermore, in the bonding apparatus of the present invention, it is preferable that the measurement unit further include a direct-current signal source that supplies a direct-current signal to the joining machine unit in order to measure the connection state between the wire and a subject device that has conductance with the stage, and a resistance component measurement circuit that measures the resistance component of the joining machine unit when the wire is joined to the subject device, so that the connection state between the wire and the subject device be judged based on the output of a potential measurement circuit.

Furthermore, in the present invention, the measurement unit can be provided with a measurement switching circuit that switches between measuring the connection state using the capacitance comparison circuit and measuring the connection state using the resistance component measurement circuit.

In addition, in the bonding apparatus of the present invention, it is preferable that the joining machine unit include a torch that rounds the tip of the wire, and the machine capacitance component include the capacitance component of the torch; and the bonding apparatus can be further provided with a torch switching circuit that switches the connection with the torch either to the measurement unit or to a high-voltage power supply connected to the torch.

As seen from the above, in the bonding apparatus according to the present invention, the measurement unit is comprised of an equivalent capacitance circuit that has substantially the same capacitance as the machine capacitance component between the joining machine unit and the stage when the wire is not in contact with the subject device as an equivalent circuit for compensating the capacitance component of the joining machine unit; and using an alternating-current signal, the impedance of the joining machine unit when the wire is in contact with the device and the impedance of the equivalent capacitance circuit are compared; and the connection state between the wire and the subject device is judged based on the output of the capacitance comparison circuit. Accordingly, the capacitance component of the joining machine unit can be compensated with good precision, and the connection state between the wire and the subject device can be measured with good precision.

In the bonding apparatus of the present invention, the equivalent capacitance circuit changes a manner of connection of each one of the capacitance elements by controlling the on/off state of the plurality of switch elements for the plurality of capacitance elements and generates a capacitance value substantially equivalent to the machine capacitance component; accordingly, the capacitance component of the joining machine unit can be electronically compensated with good precision.

In the bonding apparatus of the present invention, the switch switching circuit switches each one of the switch elements so as to minimize the output of the capacitance comparison circuit when the wire is not in contact with the subject device; accordingly, the capacitance component of the joining machine unit can be automatically compensated with good precision.

In addition, in the bonding apparatus of the present invention, each capacitance element respectively has a capacitance value that is 2-50% of the value of the machine capacitance component, and each one of the switch elements has a capacitance value that is 2-50% of the value of the capacitance in the capacitance element having the least capacitance; accordingly, it is possible to compensate with precise adjustments that are sufficiently small compared to the capacitance component of the joining machine unit.

Furthermore, the output of the capacitance comparison circuit is averaged and processed at an arbitrary sampling interval; accordingly, fluctuation in the output of the capacitance comparison circuit (an alternating-current signal) is minimized, and judgments of the connection state can be stably made.

Also, since the connection state judgment is referenced to an arbitrarily set threshold value in relation to the averaged output, judgments can be made using a stabilized reference.

Furthermore, since the threshold value is updated, it is possible to make connection state judgments that track changes over time in continuous operation. Also, threshold values are changed and set according to the type of subject device; accordingly, judgments on the connection state can be made to match the characteristics of the subject device.

In the present invention, the threshold value is set to a value that corresponds to the output of the capacitance comparison circuit when it has been minimized by the switch switching means; accordingly, the connection state decision is made based on capacitance changes related to connection that remain after the machine capacitance has been compensated, and the connection state decision can be made with good precision without being influenced by the machine capacitance.

Furthermore, the connection state judgment processing judges whether or not it is possible to detect adhesion/non-adhesion of the subject device; accordingly, it can judge, for example, that the presence of a foreign substance or the like makes connection impossible. Also, since adhesion/non-adhesion between the wire and the subject device is judged, if the connection is normal or not can be decided. Also, if the length of the wire tail is judged to be appropriate or not; accordingly, whether or not the wire was properly cut after connection can be judged. Tail length here refers to the tail-like length remaining at the tip of the capillary when second bonding of wire bonding ends and the capillary is raised slightly and the wire is cut. If this tail length is inappropriate, the ball-like portion at the wire tip in the next first bonding becomes inappropriate.

In the present invention, the resistance component of the joining machine unit is measured using a direct-current signal; accordingly, it is possible to judge the connection state by a simpler method when the connection state is judged utilizing the resistance component of a subject device that has conductance with the stage.

Furthermore, switching can be made between measuring the connection state using the capacitance comparison circuit and measuring the connection state using the resistance component measurement circuit; accordingly, it is possible to select an appropriate measurement method that corresponds to the subject device state.

Also, since a torch switching circuit that switches the connection with the torch to the measurement unit or to a high-voltage power supply connected to the torch is provided, the measurement unit is isolated from the torch when the high-voltage power supply is connected to the torch and damage to the measurement unit by the high-voltage power supply can be prevented.

DETAILED DESCRIPTION OF THE INVENTION

Embodiments of the present invention will be described in detail below in accordance with the accompanying drawings. In the following, the description of the present invention will be made for a bonding apparatus in which a chip is placed on a glass epoxy circuit board wired with a bonding lead, first bonding is performed on a bonding pad of the chip using a gold wire, second bonding is performed on the bonding lead, and the chip and the circuit board are interconnected. The present invention is indeed applicable to a so-called bump formation bonding apparatus that which performs a first bond only.

Also, the object of bonding is not limited to a chip placed on a glass epoxy circuit board; and it is possible to use a subject device so long as it does not have electrical conductance with the stage. For example, the present invention can be used when a chip is placed on a ceramic substrate and a wire is bonded to a bonding lead on the ceramic substrate and a bonding pad of the chip. Also, a subject device that does not have electrical conductance with the stage can be a combination other than an insulating substrate and a chip. For example, a combination of an insulating substrate and an electronic component, a combination of an insulating substrate and a simple wiring pattern thereon, etc. are also possible. In addition, the wire does not have to be a gold wire. For example, an aluminum wire, copper wire, etc. for wire bonding can be used. In such cases, if it is not necessary to round the wire tip when performing first bonding, a structure for installing the torch can be omitted.

Figure 1:
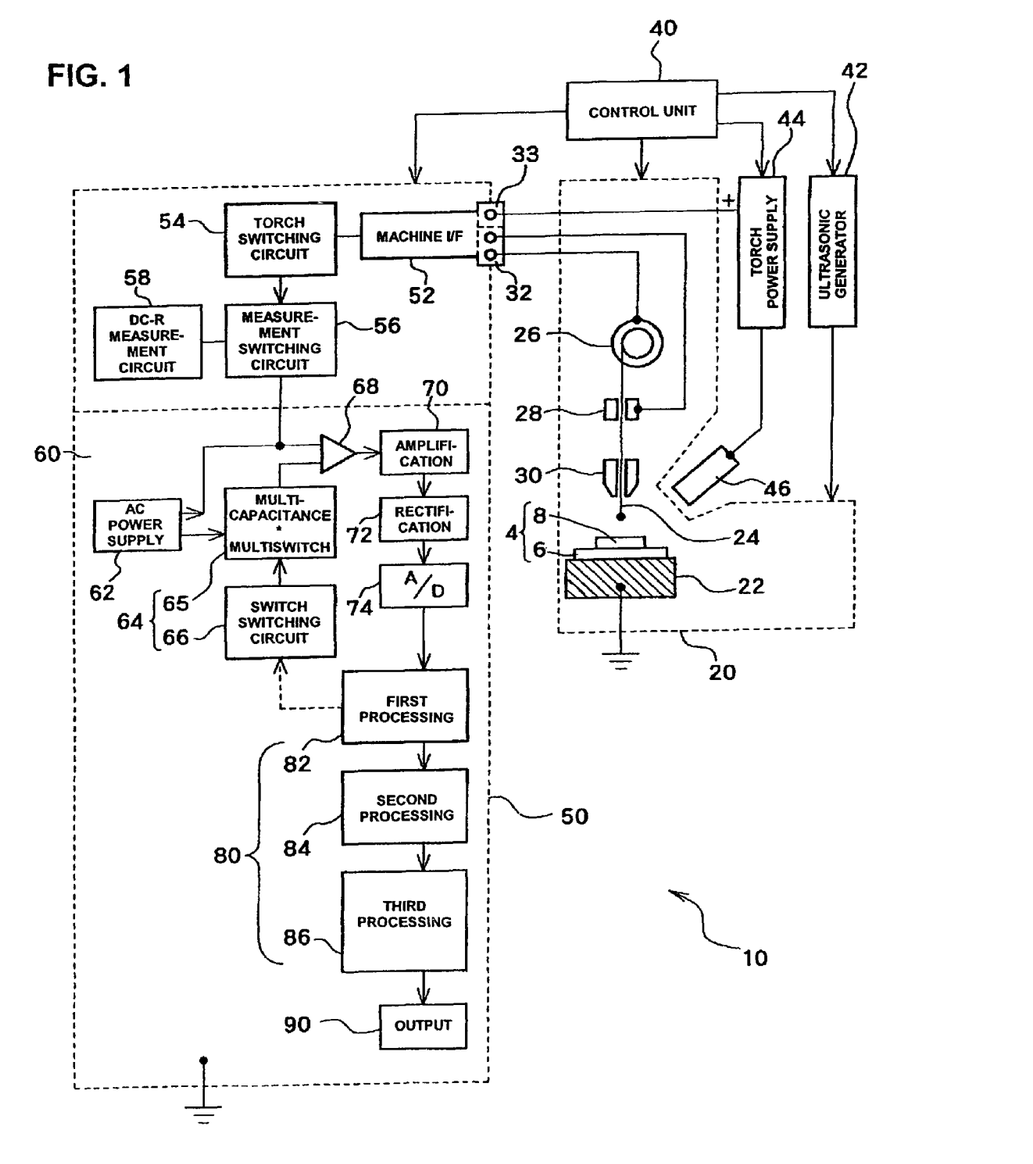
FIG. 1 is a structural diagram of the wire bonding apparatus in accordance with the embodiment of the present invention.

FIG. 1 shows the structural configuration of a wire bonding apparatus 10.

Though not a constituent element of the wire bonding apparatus 10, a subject device 4, which is the object of bonding, is shown in FIG. 1; and the subject device 4 is comprised of a glass epoxy circuit board 6 and a chip 8 which is placed on the circuit board 6. A bonding lead is provided on the glass epoxy circuit board 6, and a bonding pad is provided on the chip 8. The chip 8 is a semiconductor LSI (large-scale integrated circuit), for example.

The wire bonding apparatus 10 includes a joining machine unit 20, which is the mechanism portion for joining a wire to the subject device 4; a measurement unit 50, which measures the connection state between the subject device 4 and the wire; a control unit 40, which controls the operation of the entire apparatus; and other elements such as an ultrasonic generator 42, a torch power supply 44, and a torch 46.

The ultrasonic generator 42 generates ultrasonic energy for bonding; when the bonding operation is executed, its ultrasonic energy is transmitted to a capillary 30 via a bonding arm which is not shown in the drawing.

The torch power supply 44 and torch 46 have the function of melting the tip of a wire 24 immediately before first bonding and forming a ball-like shape. More specifically, one (positive polarity) terminal of the torch power supply 44 (a high-voltage power supply) is connected to the torch 46, and the other (negative polarity) terminal is connected to the wire 24. Exactly the appropriate spatial distance is opened between the torch 46 and the tip of the wire 24, high voltage is applied therebetween, the tip of the wire 24 is melted by discharge, etc., and a ball-like shape is formed at the tip of the wire 24. In first bonding, the wire tip in the ball-like shape is pressed against the subject device 4, ultrasonic energy is supplied, and bonding is performed.

The torch power supply 44 is not connected directly to the wire 24, and it is connected to the measurement unit 50 via a connector 33; and under the control of a torch switching circuit 54 (which will be described later), it is connected to the wire 24 only when measurement is not taking place. This prevents the high-voltage signal from invading the measurement circuits of the measurement unit 50.

The joining machine unit 20 comprises a stage 22 that supports the subject device 4; a spool 26 that unwinds the wire 24; a wire damper 28 that clenches or releases the wire 24 and controls its movement; and the capillary 30, through which the wire 24 passes, and which receives the supply of ultrasonic energy for wire bonding from the ultrasonic generator 42.

The stage 22 is made of metal and is grounded. The stage 22 may include a heater for heating the subject device 4 for wire bonding. The spool 26, wire damper 28, and torch 46 are connected by appropriate conductor wires to the connector 33, which is an interface with the measurement unit 50.

In the structure described above, when the spool 26, wire damper 28, etc. are the mechanism for performing wire bonding on the subject device 4, the terminals of the connector 32 are used when measuring impedance with reference to the stage 22, which is at ground potential. Accordingly, a judgment on the connection state can be made by connecting a measurement device that can measure the impedance to the connector 32 and measuring the change before and after connecting the wire 24 to the subject device 4. In addition to the above-described elements, when there is an impedance component involved in connecting the subject device 4 and the wire 24, they can also be connected to the connector 32. For example, the capillary 30 can also be connected to the connector 32.

The measurement unit 50 is a circuit that measures the impedance of the joining machine unit 20. More specifically, the measurement unit 50 has the function of measuring changes in capacitance before and after wire bonding and judging the connection state. Accordingly, it compensates the machine capacitance that is fundamental and intrinsic to the joining machine unit 20. The measurement unit 50 has additional functions including the function of switching to judging the connection state using changes in resistance before and after wire bonding when that is convenient, the function of protecting the measurement circuits from the high voltage supplied to the torch 46 from the high-voltage power supply 44, etc.

The measurement unit 50 is comprised of a machine I/F 52, a torch switching circuit 54, a measurement switching circuit 56, a DC-R measurement circuit 58, and an AC-C measurement circuit 60. The machine I/F 52 is an interface circuit between the joining machine unit 20 and the torch power supply 44 and includes the connectors 32 and 33, and it can be constituted by appropriate protective circuits, etc. The torch switching circuit 54 switches the connection of the machine I/F 52 to the torch power supply 44 or to the measurement switching circuit 56. The measurement switching circuit 56 switches the connection of the machine I/F 52 to the DC-R measurement circuit 58 or to the AC-C measurement circuit 60 when the connection of the machine I/F 52 is switched to the measurement switching circuit 56 by the torch switching circuit 54.

The torch switching circuit 54 is a switch circuit that has the function of blocking the torch power supply 44 terminal of the connector 33 from the measurement circuit when the torch is operating, so that high-voltage signals from the torch power supply 44 do not travel around the measurement circuit.

Figure 2:
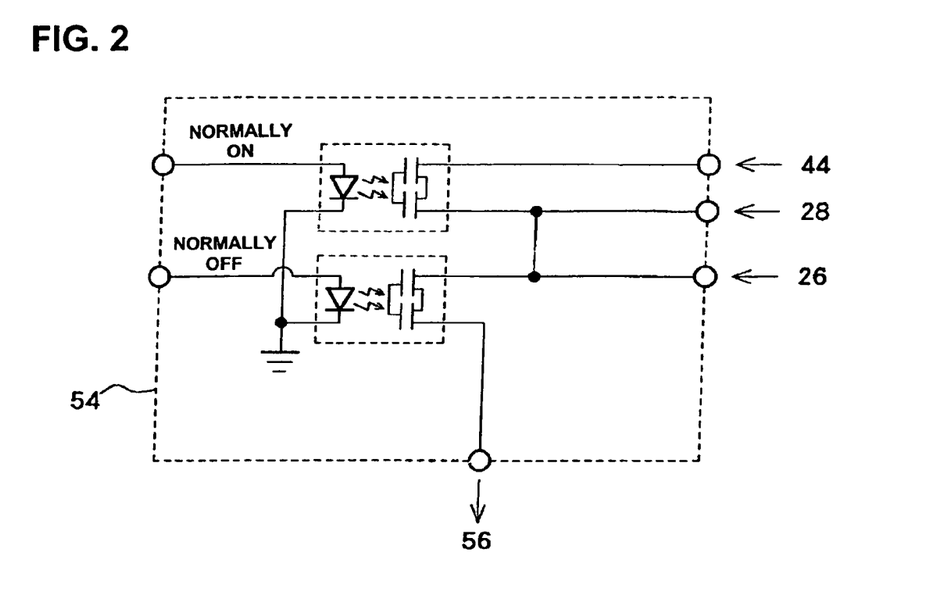
FIG. 2 is a circuit diagram showing the specific structure of the torch switching circuit in accordance with the embodiment of the present invention.

FIG. 2 is a circuit diagram showing the specific structure of the torch switching circuit 54. An element that can turn a MOS transistor on and off using light is used as the switch element in order to prevent high-voltage influx. Other appropriate switch elements can be used, of course.

In the FIG. 2 constitution, the normal state is not conducting measurement, and two switch elements are set as normally on and normally off. The torch power supply 44 terminal, the spool 26 terminal, the wire damper terminal, and the terminal on the measurement switching circuit 56 side are appropriately connected to these two switch elements. During normal non-measurement, the torch power supply 44 terminal, the spool 26 terminal, and the wire damper terminal are connected; and during measurement, the connections between these are blocked, and the spool 26 terminal and the wire damper 28 terminal—that is, the terminals of the connector 32—can be connected to the terminal on the measurement switching circuit 56 side.

The measurement switching circuit 56, as described above, is a circuit that has the function of switching to judging the connection state using changes in resistance before and after wire bonding when that is convenient. More specifically, during measurement, the connector 32 terminals are connected to the input side of the measurement switching circuit 56 by the torch switching circuit 54, and changes in resistance are outputted to the DC-R measurement circuit 58 or the AC-C measurement circuit 60, according to the characteristics of the subject device 4, following instructions from the control unit 40 or instructions from the control unit 40 channeling user instructions. A switch element described with reference to FIG. 2 can be used for output switching.

Switching the measurement switching circuit 56 can be determined by whether or not there is conductance between the subject device 4 and the stage 22 when the subject device 4 is supported or set on the stage 22. When there is no conductance, changes in resistance is outputted to the AC-C measurement circuit 60. When there is conductance, changes in resistance are outputted to the AC-C measurement circuit 60, but switching the output of the changes in resistance to the DC-R measurement circuit 58 becomes simpler measurement and is often preferred.

The DC-R measurement circuit 58 supplies a direct-current (DC) signal to the subject device 4, measures changes in its resistance (R) component, and determines the connection state between the wire 24 and the subject device 4. Changes in the resistance component is detected by applying a direct-current signal to the connector 32 and measuring the potential at the connector 32 or the current flowing there at that time. When the wire 24 is not connected to the subject device 4, the connector 32 forms an open end in relation to the stage 22, which is at ground potential; and when the wire 24 is connected to the device 4, current flows from the connector 32 to the ground-potential stage 22 via the wire 24 and the subject device 4. Accordingly, the connection state between the wire 24 and the subject device 4 can easily be detected by measuring the potential of the connector 32 or the current flowing there.

Figure 3:
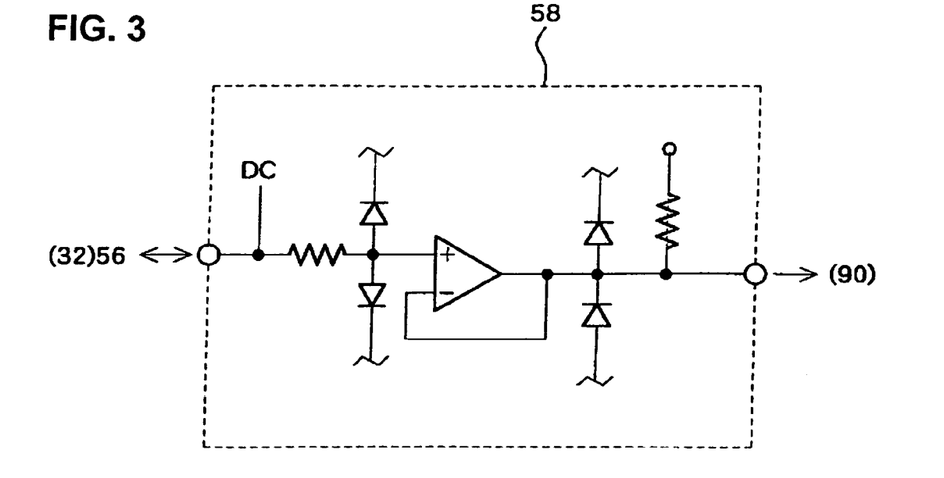
FIG. 3 is a circuit diagram showing the specific structure of a DC-R measurement circuit in accordance with the embodiment of the present invention.

FIG. 3 is a circuit diagram showing the specific constitution of the DC-R measurement circuit.

A DC from a direct-current power supply which is not shown in the drawing is applied to the connector 32, the current flowing in the connector 32 at that time is detected by a resistance element, amplifier, etc. and is displayed, for example, at the output unit 90 of the measurement unit 50. As DC signal supplied from the direct-current power supply, +1V can be used; and it is preferable that −1V can be supplied with the polarity changed.

The AC-C measurement circuit 60 supplies an alternating-current (AC) signal to the subject device 4, measures the changes in its capacitance (C) component, and judges the connection state between the wire 24 and the subject device 4.

The AC-C measurement circuit 60 is comprised of an AC power supply 62, an equivalent capacitance circuit 64 that creates capacitance substantially equivalent to the capacitance component of the joining machine unit 20 before bonding, a differential circuit 68 that finds the difference between the capacitance of the joining machine unit 20 after bonding and the capacitance of the equivalent capacitance circuit 64, an amplification circuit 70 that amplifies this differential signal, a rectification circuit 72 that rectifies the signal after amplification, an A/D conversion circuit 74 that converts the output of the rectification circuit 72 to a digital signal, a judgment unit 80 that processes the digital signal and judges the connection state, and an output unit 90 that outputs the result of the judgment unit 80.

The AC power supply 62 supplies an alternating-current signal to the equivalent capacitance circuit 64 and the joining machine unit 20 in order to detect the capacitance component. More specifically, a 4.1 kHz±1V rectangular wave signal with duty 50% is outputted and is respectively supplied to the output terminal of the equivalent capacitance circuit 64 and to the connector 32 of the joining machine unit 20 via the measurement switching circuit 56, the torch switching circuit 54, and the machine I/F 52.

The equivalent capacitance circuit 64 creates and supports capacitance substantially equivalent to the machine capacitance component before bonding, i.e. the capacitance component of the joining machine unit 20 when the wire 24 is not in contact with the subject device 4. Here, the "machine capacitance component" is the capacitance between the ground and the line connecting the output of the AC power supply 62 supplied to the joining machine unit 20 side and the input of the differential circuit 68. More specifically, the line connecting the output of the AC power supply 62 and the input of the differential circuit 68 reaches to the spool 26 and wire damper 28 via the measurement switching circuit 56, torch switching circuit 54, machine I/F 52, and connector 32; accordingly, the "machine capacitance component" is a capacitance relative to ground of the joining machine unit 20 including these paths.

The equivalent capacitance circuit 64 is comprised of a portion 65 and a switch switching circuit 66. The a portion 65 of the equivalent capacitance circuit 64 consists of a plurality of capacitances and a plurality of switches for interconnecting or opening the capacitances, and the switch switching circuit 66 controls the on/off states of the plurality of switches and achieves the desired capacitance value.

Figure 4:
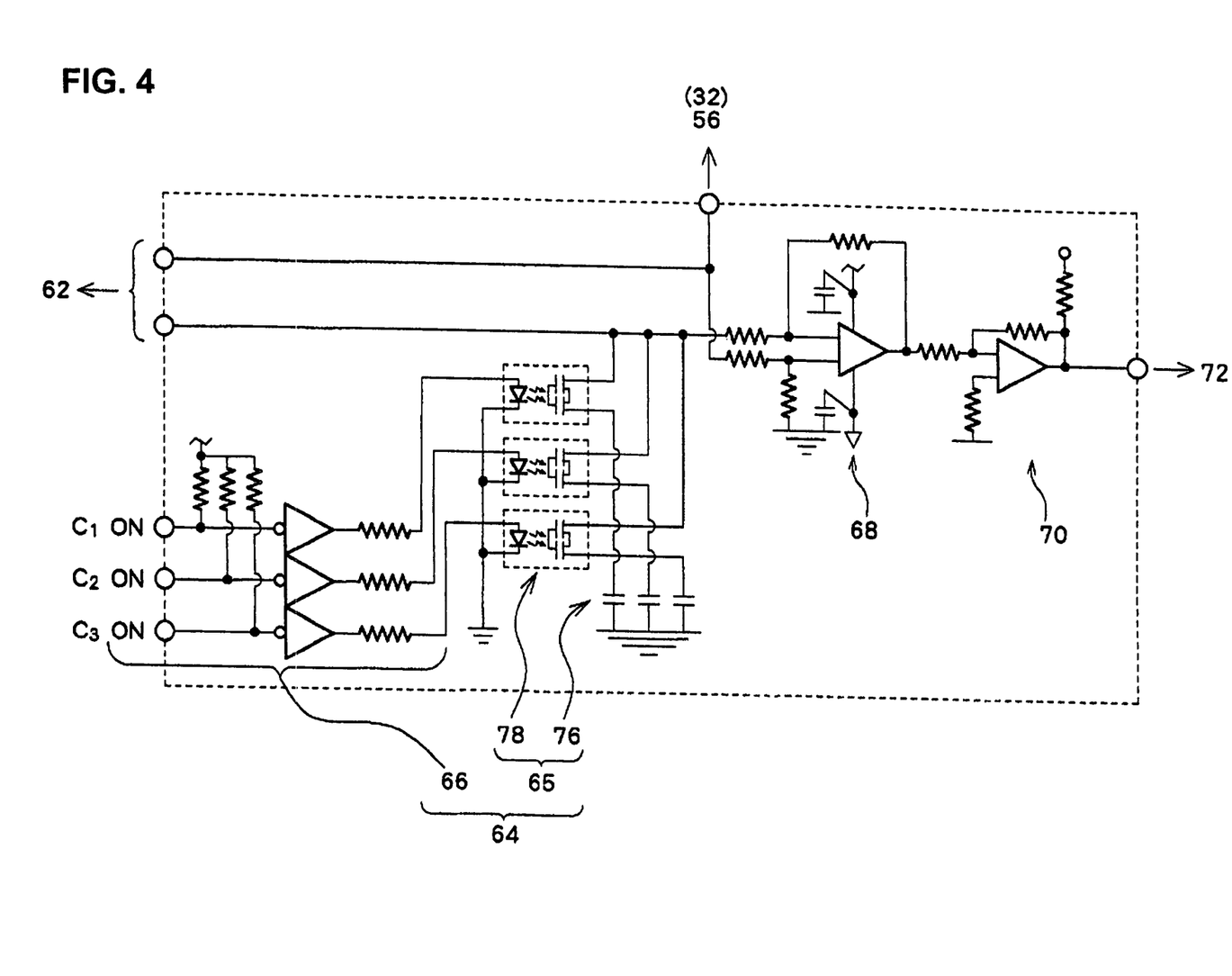
FIG. 4 is a circuit diagram showing the specific structure of an equivalent capacitance circuit and differential circuit and around the amplification circuit.

FIG. 4 is a circuit diagram showing the specific constitution of the equivalent capacitance circuit 64, differential circuit 68, and around the amplification circuit 70.

The portion 65 of the equivalent capacitance circuit 64 that is the plurality of capacitances and the plurality of switches comprises three capacitances 76 with mutually different capacitance values and three switches 78 for combining these three capacitances in various ways by parallel connection, as shown in FIG. 4. The capacitances of the three capacitances preferably have values that differ by multiples of two. In the shown embodiment of FIG. 4, 10 pF, 20 pF, and 40 pF are selected. The capacitance values of capacitors, which are small electronic components, are often rated and standardized; accordingly, in practice components with capacitance values closest to these values may be used. For example, ones with 10 pF, 22 pF, and 39 pF can be used. The three capacitance switches 78 that are used are elements that can turn MOS transistors on and off using light, as described in FIG. 2; and it is especially preferable to use switching elements with little parasitic capacitance. In the shown embodiment, when the minimum value of the three capacitances is 10 pF, it is preferred to use switching elements whose parasitic capacitance is 2%-50% thereof. Doing so minimizes the effect of parasitic capacitance and makes it possible to generate capacitance in more accurate combinations. AQY221N2S (trade name: PhotoMOS Relay) manufactured by Matsushita Electric Works, Ltd, etc. can be used for such element, for example.

The switch switching circuit 66 has the function of appropriately turning the three switches 78 on and off and changing the connection relationships of the three capacitances 76 and thus setting the value of the overall capacitance to the desired value. FIG. 4 shows a part thereof; and 10 pF, 20 pF, and 40 pF respectively can be added by parallel connection by the three control terminals. In other words, an overall capacitance of 10 pF is produced by turning the control terminal for 10 pF on, an overall capacitance of 30 pF is produced by turning the control terminal for 10 pF and the control terminal for 20 pF on, and an overall capacitance of 70 pF is produced by turning the control terminal for 10 pF, the control terminal for 20 pF, and the control terminal for 40 pF all on. By thus selecting combinations of the states of the three control terminals, it is possible to set eight types of capacitance: 0 pF, 10 pF, 20 pF, 30 pF, 40 pF, 50 pF, 60 pF, and 70 pF. For example, if the value of the machine capacitance component is 60 pF, then both the control terminal for 20 pF and the control terminal for 40 pF are turned on.

The differential circuit 68 has the function of finding and outputting the difference between the actual capacitance of the joining machine unit 20 and the capacitance of the equivalent capacitance circuit 64. The difference between the actual capacitance of the joining machine unit 20 when it is doing bonding in the bonding operation and the capacitance of the equivalent capacitance circuit 64 is outputted. An ordinary differential amplification circuit connected to appropriately set circuit elements can be used as such a differential circuit 68.

In order to obtain differential output, an alternating-current signal is applied to the joining machine unit 20 from the AC power supply 62, and the response when doing so is supplied to the input terminal at one side of the differential circuit 68. Likewise, an alternating-current signal is applied to the equivalent capacitance circuit 64 from the AC power supply 62, and the response when doing so is supplied to the input terminal at the other side of the differential circuit 68. More specifically, as shown in FIG. 4, the AC power supply 62 is connected to the connector 32, and the connector 32 is connected to the input terminal at one side of the differential circuit 68. Also, the AC power supply 62 is connected to the output terminal of the equivalent capacitance circuit 64, and this output terminal is connected to the input terminal at the other side of the differential circuit 68. It is preferred to provide a suitable protective circuit between the output terminal of the equivalent capacitance circuit 64 and the AC power supply 62 so as to prevent an overlarge signal from being applied to the equivalent capacitance circuit 64.

The amplification circuit 70 is a circuit, obtained in this manner, for appropriately amplifying the differential signal of the signal due to the capacitance component of the equivalent capacitance circuit 64 and the signal due to the actual capacitance component of the joining machine unit 20. The amplification circuit 70 can be constituted using an ordinary operating amplifier.

The rectification circuit 72 is a circuit that has the function of taking the amplified alternating-current signal, which appears as one that has positive and negative coding, and rectifying the component on the negative side and producing a positive-side signal.

FIGS. 5A through 5D are diagrams schematically showing the pattern of changes in the respective signal waveforms of the differential circuit 68, the amplification circuit 70, and the rectification circuit 72.

Figure 5A:
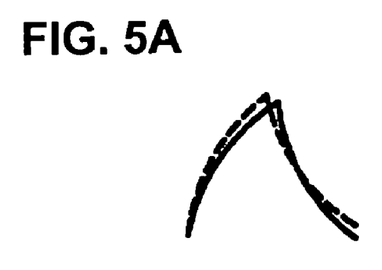
FIGS. 5A through 5D are diagrams schematically showing changes in the respective signal waveforms of a differential circuit, amplification circuit, and rectification circuit in accordance with the embodiment of the present invention.
Figure 5B:
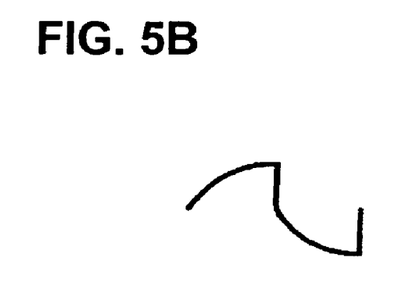
Figure 5C:
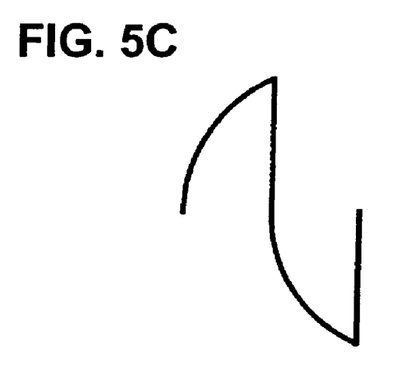
Figure 5D:
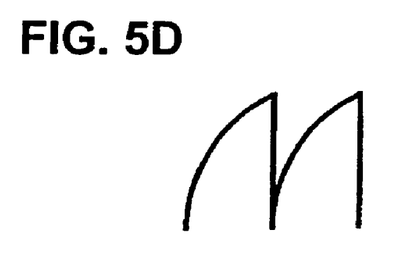

FIG. 5A shows the two input waveforms of the differential circuit 68 as a solid line and a broken line respectively. As described above, if the alternating-current signal supplied from the AC power supply 62 is 4.1 kHz, the two signals have nearly the same cycle, i.e. repeating at nearly 4.1 kHz. FIG. 5B is the output waveform of the differential circuit 68, and the difference between the two signals in 5A is shown. FIG. 5C is the output waveform of the amplification circuit 70, and the differential signal is amplified. FIG. 5D is the output waveform of the rectification circuit 72, and the signal oscillating between positive and negative relative to the reference potential in FIG. 5C exhibits a pattern of being rectified to the positive side.

The A/D conversion circuit 74 has the function of converting the rectified signal to a digital signal. Using this output makes it possible for the processing by subsequent judgment unit 80 to be done by digital calculation using software, at high speed, with high-precision judgments. Such an A/D conversion circuit 74 can use a well-known A/D conversion IC, etc.

The judgment unit 80 has the function of processing the digitized signal from the A/D conversion circuit 74 and judging the connection state between the wire 24 and the subject device 4. This function includes sampling/averaging processing 82 ("First Processing" in FIG. 1), threshold value setting/updating processing 84 ("Second Processing" in FIG. 1), and processing to determine if connection is possible, adhesion/non-adhesion, and tail appropriate/inappropriate ("Third Processing" in FIG. 1). These processes can be implemented by executing software on a computer. The computer may be provided in the measurement unit 50; if the control unit 40 is constituted with a computer, this computer may also be used. Software execution can be implemented using a corresponding connection state decision program. Some of these functions may also be implemented with hardware.

The sampling/averaging processing 82 is a process that has the function of reducing noise by averaging the output of the A/D conversion circuit 74. The averaging processing first samples the output of the A/D conversion circuit 74 at a suitable sampling rate, then adds each datum in each sampling within an arbitrarily determined interval, and divides this by the number of samplings within that interval. When averaging, a suitable weighting may be applied. To give one example of sampling, in the above-described example, when the output cycle of the A/D conversion circuit 74 is 1/(4.1 kHz)=0.244 msec, it is possible to set a sampling rate of 12 μsec and make the interval for averaging 1 (one) msec. Other sampling parameters can also be set, of course.

Before explaining the next processing, matching by the equivalent capacitance circuit 64 using the data of this sampling/averaging processing 82 will be described.

The averaged data produced by the sampling/averaging processing 82 is data that reflects the difference between the actual joining machine unit 20 capacitance and the equivalent capacitance circuit 64 capacitance, and moreover it is amplified and digitized and averaged; accordingly, it can be considered data that is stable and reliable and has rather good sensitivity. Using this data to control the switch switching circuit 66 makes it possible to automatically and accurately match the capacitance value of the equivalent capacitance circuit 64 to the value of the capacitance component of the joining machine unit 20 before bonding.

More specifically, the output of the sampling/averaging processing 82 is examined when the joining machine unit 20 is in a pre-bonding state and an alternating-current signal is supplied from the AC power supply 62 to the connector 32 of the joining machine unit 20 and to the output terminal of the equivalent capacitance circuit 64. If the pre-bonding value of the capacitance component of the joining machine unit 20 is the same as the value of the capacitance component of the equivalent capacitance circuit 64, the output of the sampling/averaging processing 82 is zero. If they are not the same, a data value corresponding to that difference is outputted. Therefore, if the switch switching circuit 66 is controlled according to the output of the sampling/averaging processing 82, that difference is made small and ideally can become zero.

In practice, it is difficult to make the difference completely zero in a short time; accordingly, the switch switching circuit 66 is controlled so that the output of the sampling/averaging processing 82 approaches zero, and when that output has been minimized, the control state of the switch switching circuit 66 should be locked. In this way the output of the sampling/averaging processing 82 is fed back to the switch switching circuit 66, and the capacitance value of the equivalent capacitance circuit 64 can be automatically matched to nearly the same value as the value of the pre-bonding capacitance component of the joining machine unit 20.

The signal fed back to the switch switching circuit 66 is not limited to the output of the sampling/averaging processing 82; so long as it is a signal from the differential circuit 68 onward, another signal may also be used for the feed back.

Returning to the judgment unit 80 of FIG. 1, the threshold value setting/updating processing 84 is processing that sets the threshold value used in judging the output of the sampling/averaging processing 82 and updates this threshold value to correspond to the progress of the bonding operation. It sets two types of threshold values used in judging the connection state. The first threshold value is for judging whether or not connection is impossible; when connection is possible, the second threshold value is for judging whether the connection state between the wire 24 and the subject device 4 is adhesion or non-adhesion. The second threshold value is also used as a threshold value for judging if the length remaining as a tail is appropriate or inappropriate when the wire 24 is cut after being connected to the subject device 4. A threshold value for judging if the tail is appropriate or not can be set as a third threshold value, of course. Threshold value updating is performed for the second threshold value.

FIG. 6A through 6D are diagrams explaining the methods of setting two threshold values and updating the second threshold value. In practice, the method described here can be implemented by executing data processing using software in a computer. In each of FIGS. 6A through 6D, the horizontal axis shows time, and the vertical axis shows output value of the sampling/averaging processing 82, a value converted to a voltage value, for instance, being used as the output value.

Figure 6A:
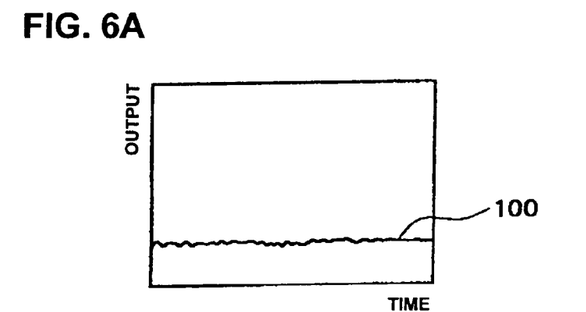
FIGS. 6A through 6D are diagrams explaining the method of setting two threshold values and updating the second threshold value in accordance with the embodiment of the present invention.

FIG. 6A shows the state when the equivalent capacitance circuit 64 matches as described above and the output value of the sampling/averaging processing 82 is minimized. As shown in FIG. 6A, in practice, the output value of the sampling/averaging processing 82 is not zero, and offset 100 is shown. In the following description, the offset 100 is 1000 mV as an example.

Figure 6B:
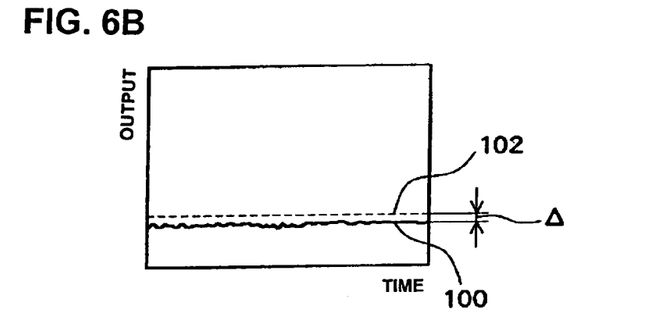

FIG. 6B is a diagram to explain setting the first threshold value. The first threshold value 102 is set to provide some degree of margin Δ from the offset 100. The value of margin Δ can be determined, taking into account measurement, through experimentation or experience, error, etc. Margin Δ can be a different value for a different wire bonding apparatus 10. In the shown example with offset 100, margin Δ is, for instance, 150 mV. Therefore, when the output value of the sampling/averaging processing 82 is 1150 mV or less, connection is judged to be not possible. The cause of connection being not possible may be that a foreign substance is present between the wire 24 and the subject device 4, for example.

Figure 6C:
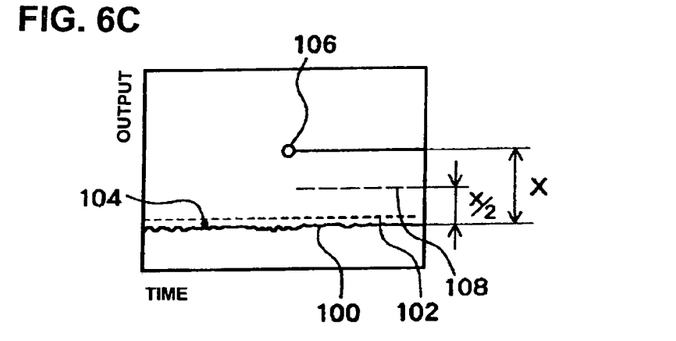

FIG. 6C is a diagram to explain setting the second threshold value. After the first threshold value 102 is set, the wire 24 is brought into contact with the subject device 4, and the output values of the sampling/averaging processing 82 are plotted in FIG. 6C as measurement points. Furthermore, in many cases there is almost no change in the output value of the sampling/averaging processing 82 between a case in which the wire 24 is pressed strongly against the subject device 4 or if ultrasonic energy is applied and a bond is actually formed and a case in which the wire is simply brought into contact. In the following description, matters using contact instead of an actual bonding operation will be described. A measurement point 104 in FIG. 6C is output that is less than the first threshold value 102; accordingly, connection is not possible, as described above. The connection-not-possible data is eliminated, and a measurement point 106 is greater than the first threshold value 102, and connection is possible. If X is the difference between the output value and the offset 100 at this time, a second threshold value 108 is set at (offset 100)+αX. α is an arbitrarily determined percentage (%). In the example in FIG. 6C, α=0.5. As one example, if the output value of the measurement point 106 is 2000 mV, X=1000 mV and the second threshold value 108 is 1500 mV. Subsequently, a measurement point below 1500 mV is judged to be non-adhesion.

Figure 6D:
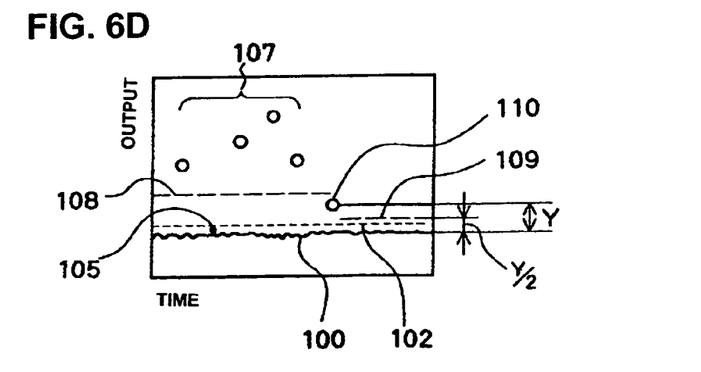

FIG. 6D is a diagram explaining the pattern of resetting the second threshold value 108. If the first threshold value 102 is 1150 mV and the second threshold value 108 is 1500 mV as described above, judgments about the connection state in subsequent bonding operations proceed with reference to these threshold values 102 and 108; but when measurement points increase and a measurement point 110 appears that is less than the second threshold value 108, then the second threshold value is reset using this new measurement point 110. In other words, in FIG. 6D, the measurement point 105 is indicative of connection-not-possible, and the plurality of measurement points 107 are higher than the second threshold value 108 set in FIG. 6C and indicate that the connection has "adhesion," but the measurement point 110 falls below the second threshold value 108 set in FIG. 6C. If Y is the difference between the output value and the offset 100 at this time, the updated second threshold value 110 is set at (offset 100)+ aY. Now, if the output value of the measurement point 110 is 1400 mV, Y=200 mV and the second threshold value 110 after updating is 1200 mV. Subsequently, 1200 mV is used as the second threshold value 109. Thereafter, in the same way, the second threshold value is updated each time a measurement point that falls below the second threshold value appears.

Updating the threshold value in this way as the bonding operation progresses reduces the effect of changes when operating continuously, etc. and makes it possible to judge the connection state with reliability. Also, once the threshold value has been set as described above, including updating, the same threshold value can be used when performing bonding on the same type of subject device 4 using the same wire bonding apparatus 10. On the other hand, when the subject device 4 is different, a changing the threshold value setting is preferred. Also, when there are more than one different connection sites on a single subject device 4, the threshold value may be different for each connection site, according to its parameters.

Figure 7:
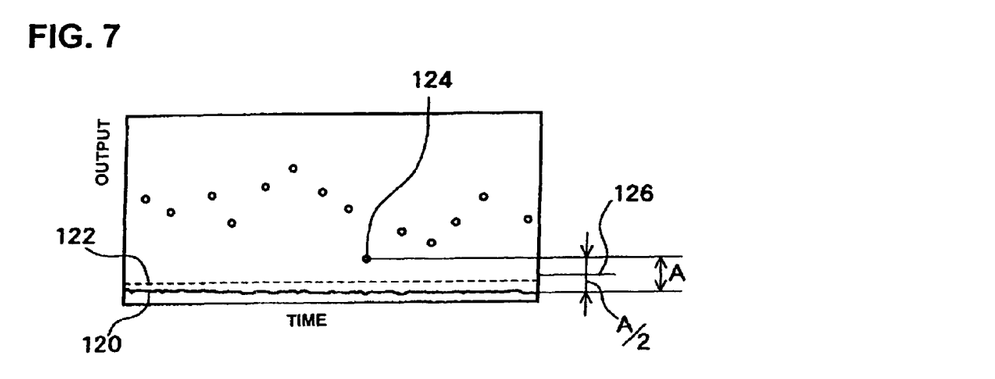
FIG. 7 is a diagram showing an example of setting a threshold value when a plurality of subject devices of the same type are repeatedly wire bonded in accordance with the embodiment of the present invention.

FIG. 7 shows the pattern of setting the same threshold value for a subject device 4 that is the same type but a different individual device when there are more than one different connection sites on a single subject device and they have the same parameters. Setting the threshold value in this case is done using a plurality of measurement point data for the subject device 4 that was measured first, and that setting value is fixed, and such threshold value is used as the threshold value for subsequent subject devices 4 that are of the same type but which are different individual devices.

More specifically, a first threshold value 122 is set using offset 120 as described above, and the second threshold value 126 is updated; accordingly, ultimately, as shown in FIG. 7, among the plurality of measurement points on the subject device 4 that was measured first, the threshold value is set using the measurement point 124, which shows the value that is closest to the offset 120. If A is the difference between the output value of this measurement point 124 and the offset 120, and using α=0.5 as in the example described above, the second threshold value 126 is (offset 120)+A/2. When next a subject device 4 that is the same type but a different individual device is bonded, the first threshold value 122 and the second threshold value 126 can be used as fixed values without performing the threshold value setting/updating processing 84 again.

Figure 8:
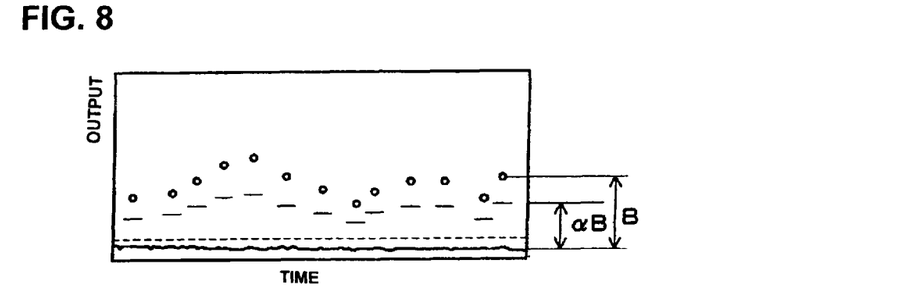
FIG. 8 is a diagram showing another example of setting a threshold value when a plurality of subject devices of the same type are repeatedly wire bonded in accordance with the embodiment of the present invention.

FIG. 8 shows an example in which there are more than one different connection sites on a single subject device 4 and they have the same parameters, and a subject device 4 that is the same type but a different individual device is bonded, and for the second threshold value a value that is the output value multiplied by a fixed coefficient α is used as the second threshold value for the next measurement point. Unlike FIG. 7, FIG. 8 shows the pattern of measurement points when the coefficient α is set based on a plurality of measurement point data for the subject device 4 that was measured first, and then used for a subject device 4 that is the same type but a different individual device. In FIG. 8, the level of the second threshold value determined according to the respective coefficients α for each measurement point is shown.

As seen from the above, when performing repeated bonding on more than one subject device 4 of the same type, it is possible to use as-is the threshold values set based on the many preceding measurement points.

Returning again to FIG. 1, the connection-not-possible, adhesion/non-adhesion, and tail appropriate/inappropriate judgment processing 86 by the judgment unit 80 uses threshold values to judge the output value of the sampling/averaging processing 82 and judges the connection state for the following three aspects: if it is possible (or ready) to connect (bond) or not, using the first threshold value; if it is in adhesion state or non-adhesion state, using the second threshold value; and if the tail length is appropriate or not. The decision results are externally displayed using the output unit 90.

The judgment "if it is possible to connect or not" is made according to whether the output value of the sampling/averaging processing 82 is smaller or larger than the first threshold value.

The judgments "if it is in adhesion state or non-adhesion state" and "if the tail length is appropriate or not" use different handling of the second threshold value; accordingly, they will be described below.

Figure 9A:
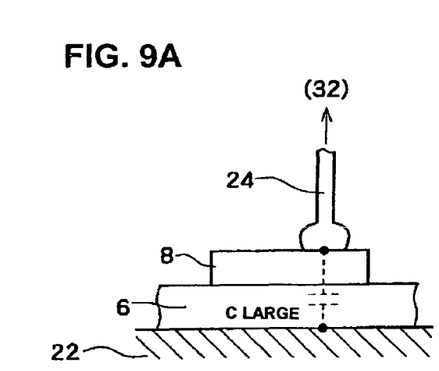
FIGS. 9A and 9B are diagrams schematically explaining how capacitance changes according to the adhesion state or non-adhesion state in accordance with the embodiment of the present invention.
Figure 9B:
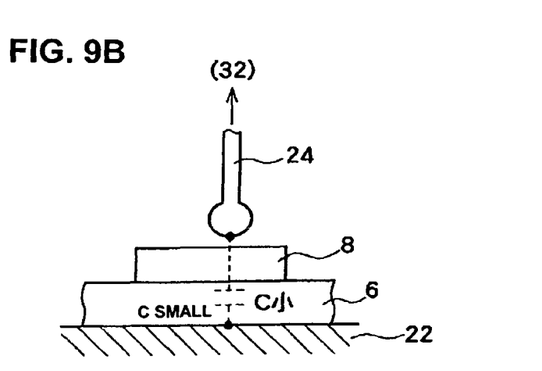
Figure 10A:
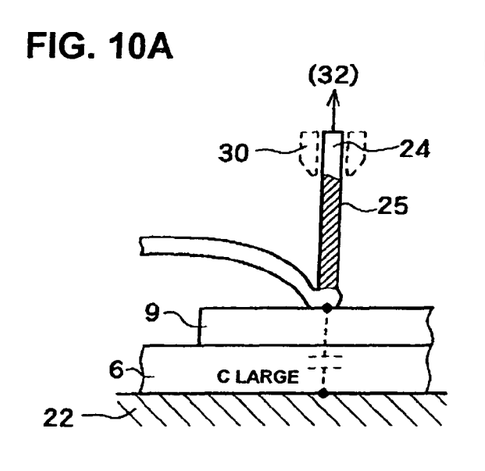
FIGS. 10A and 10B are diagrams schematically explaining how capacitance changes according to whether the tail length is appropriate or not in accordance with the embodiment of the present invention.
Figure 10B:
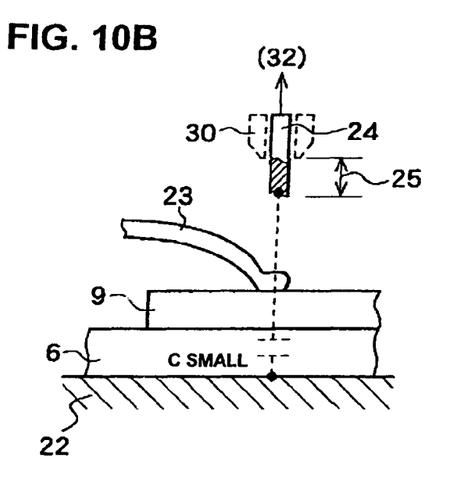

FIGS. 9A and 9B schematically show how capacitance changes according to adhesion/non-adhesion state, and FIGS. 10A and 10B schematically show how capacitance changes according to whether the tail length is appropriate or not. Elements that are the same as in FIG. 1 are assigned the same symbols and detailed description thereof is omitted.

FIG. 9A is the "adhesion" state with the wire 24 properly connected to the chip 8, and 9B is the "non-adhesion" state with the wire 24 separated from the chip 8 and not properly connected. The magnitude of the capacitance between the connector 32 and the stage 22 that is the capacitance component of the joining machine 20 at this time is compared. Since the wire 24 is a conductor, the capacitance becomes larger as the distance between the lower tip of the wire 24 and the stage 22 becomes smaller. More specifically, the "adhesion" state has a larger capacitance value ("C Large" in FIG. 9A) than the "non-adhesion" state ("C Small" in FIG. 9B). In other words, the output value of the sampling/averaging processing 82 is a larger value for the "adhesion" state than for the "non-adhesion" state.

Though FIGS. 9A and 9B show the first bonding, the second bonding has the same result as well and can be shown as in FIGS. 9A and 9B.

FIGS. 10A and 10B show the situation after normal second bonding on the bonding lead 9 and before the wire 24 is cut to leave a tail 25.

In FIG. 10A, the wire 24 is in the proper length, and the length of the tail 25 is "appropriate." Afterward, the wire damper 28 (see FIG. 1) is closed, and the wire is cut, leaving the tail 25 with the desired length. Thus, when the length of the tail 25 is "appropriate," the tail 25 is connected to the bonding lead 9, and capacitance is large ("C Large" in FIG. 10A).

FIG. 10B shows the case in which the wire 24 was cut before being put into the proper length, and the tail length is "inappropriate." In this case the tail 25 is not connected to the bonding lead 9; accordingly, capacitance is small ("C Small" in FIG. 10B).

If the magnitude of the capacitance between the connector 32 and the stage 22 that is the capacitance component of the joining machine 20 is compared in this way, the "appropriate" state has a larger capacitance value than the "inappropriate" state. In other words, the output value of the sampling/averaging processing 82 is a larger value for the "appropriate" state than for the "inappropriate" state. The capacitance threshold value for "adhesion" and "non-adhesion" and the capacitance threshold value for "appropriate" and "inappropriate" do not always have to be the same.

As seen from the above, by thus comparing the output value of the sampling/averaging processing 82 and the magnitude of the first threshold value and second threshold value, it is possible to make various judgments regarding the connection state: connection possible (ready) or not (not ready), in adhesion state or in non-adhesion state, and tail length appropriate or inappropriate. Though these three types of judgments can all be performed, some of them can be omitted.

Next, the operation by the above-described structure will be explained according to a wire bonding work procedure with reference to FIG. 11.

Figure 11:
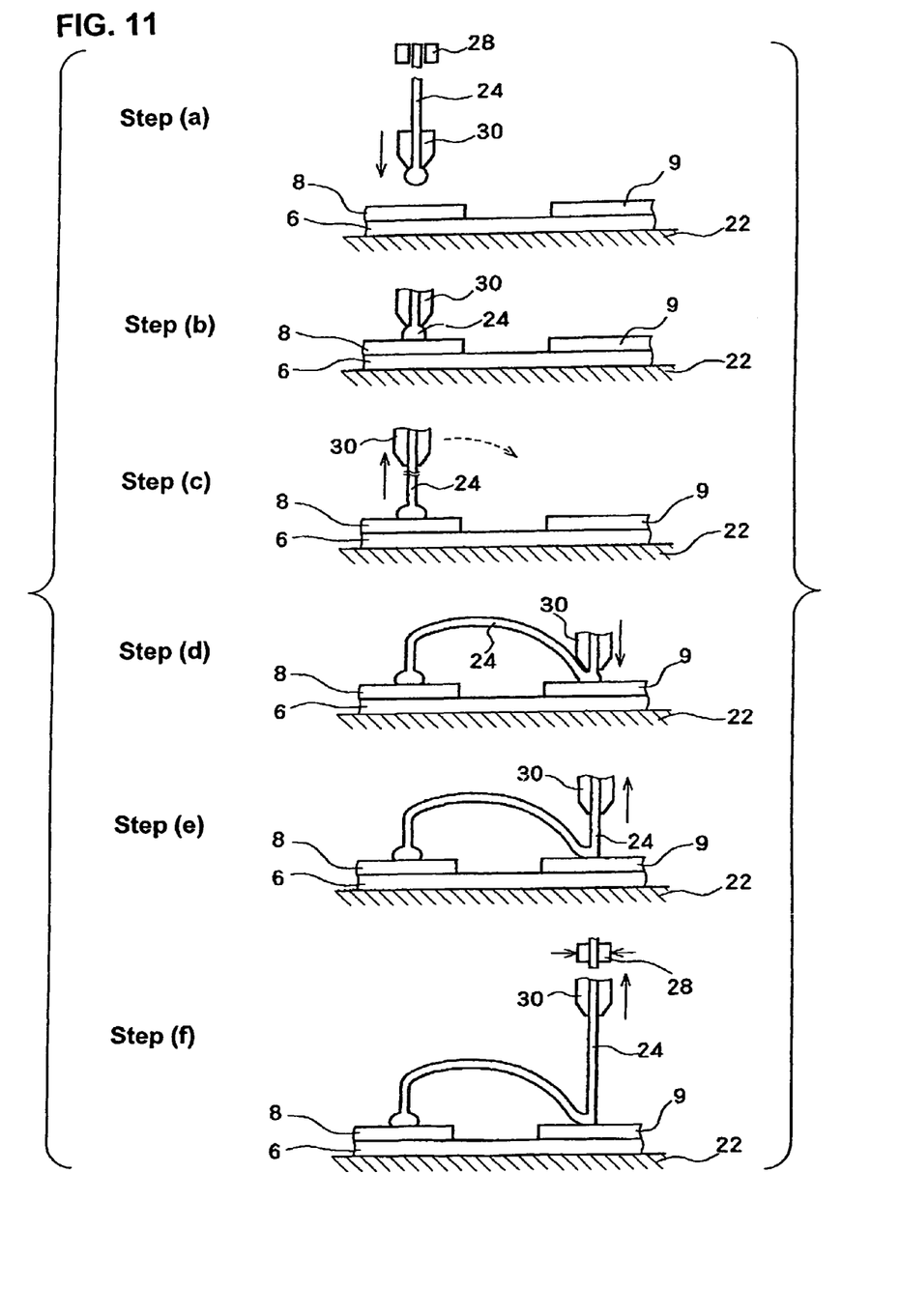
FIG. 11 shows the bonding steps (a) through (f), explaining how the connection state is judged in accordance with the embodiment of the present invention.

FIG. 11 shows the sequence of steps in which the glass epoxy circuit board 6 is supported or set on the stage 22, the chip 8 and bonding lead 9 are provided on the glass epoxy circuit board 6, and the wire 24 is connected between the bonding pad (not shown in the drawing) of the chip 8 and the bonding lead 9. Elements that are the same as in FIG. 1 are assigned the same symbols and detailed description thereof is omitted.

In step (a), the state immediately before performing first bonding on the chip 8 is shown. Rounding the tip of the wire 24 into a ball-like shape using the torch power supply 44 and torch 46 is performed as described above. The wire 24 having this ball-like tip is lowered toward the chip 8 by the descent motion of the capillary 30. When this happens, the wire damper 28 is open, and the wire 24 is reeled out from the spool 26 (see FIG. 1) by the descent motion of the capillary 30. Until this time—that is, until the wire 24 makes contact with the chip 8—the capacitance value of the equivalent capacitance circuit 64 of the measurement unit 50 matches the value of the capacitance component of the joining machine unit 20. Then, in addition, the first threshold value is set. Also, the second threshold value is set based on previous results with the same type of bonding as well.

In step (b), the wire 24 makes contact with the bonding pad of the chip 8. At this time the capacitance value of the joining machine unit 20 (see FIG. 1) changes compared to before bonding; accordingly, the measurement unit 50 (see FIG. 1) compares this to the capacitance value of the matched equivalent capacitance circuit 64 (see FIG. 1), outputs the difference, does amplification and rectification and A/D conversion, and then performs sampling/averaging processing, compares that output to the first threshold value, and then judges whether connection is possible or not using the method described in FIG. 6.

If it is judged that connection is possible to make, it next judges adhesion/non-adhesion (state) using the second threshold value and the method described in FIGS. 9A and 9*b*. If it is judged that the connection is in the "adhesion" state, it advances to the next step. If it judges the connection state is in "non-adhesion" state or if it previously decided that connection was not possible (or not ready), that result is outputted by an appropriate display or notification lamp, etc. The operation of the wire bonding apparatus 10 may be halted. A worker can examine that output and take appropriate measures.

Step (c) shows the state of continuing on if the first bonding connection state is judged to be the "adhesion" state. If "adhesion" was judged in step (b) or if ultrasonic energy was supplied to the capillary 30 previous to that, bonding is performed. Then, the capillary 30 is moved in the direction of the bonding lead 9 according to a predetermined movement path. When this occurs, the measurement unit 50 also continues to monitor adhesion/non-adhesion. If non-adhesion results from the movement of the capillary 30, that result is outputted, and the worker can take appropriate measures.

In step (d), the wire 24 is put into contact with the bonding lead 9 in order to perform second bonding. At this time also, the adhesion/non-adhesion is judged by the method with reference to FIGS. 9A and 9B. Outputting of the decision results is the same.

Step (e) shows the state of continuing on if the second bonding connection state is judged to be in the "adhesion" state. If "adhesion" was decided in step (d) or if ultrasonic energy was supplied to the capillary 30 previous to that, bonding is performed. Then, the capillary 30 is raised upward. When this occurs, the measurement unit 50 also continues to monitor adhesion/non-adhesion as described above.

In step (f), the capillary 30 is raised to an arbitrarily determined height in order to cut the tail, the wire damper 28 is closed, the wire 24 being in the state of just before being cut by the action of the capillary 30. The height for tail cutting can be set at about 300 μm, for example. Then, tail length appropriateness/inappropriateness is judged by the method described in FIGS. 10A and 10B. Outputting of the decision results is the same as described above.

The connection state between the subject device 4 and the wire 24 is measured as described above in real-time through the sequence of steps in wire bonding, and the result is also outputted in realtime.

The invention claimed is:

1. A bonding apparatus comprising a stage that supports a subject device and is grounded, a joining machine unit that joins a wire to the subject device, and a measurement unit that measures a connection state between the subject device and the wire; wherein the measurement unit comprises:
   a variable equivalent capacitance circuit that is a variable equivalent circuit which compensates for a capacitance component of the joining machine unit in order to measure a connection state between the wire and a subject device that has no electric conduction with the stage, said variable equivalent capacitance circuit selecting and setting a variable capacitance value equivalent to the capacitance component of the joining machine unit before bonding, said capacitance component of the joining machine unit being the capacitance between the wire and the stage;
   an alternating-current signal source that supplies an alternating-current signal to the equivalent capacitance circuit and the joining machine unit, respectively;
   a capacitance comparison circuit that compares the capacitance component of the joining machine unit after bonding and the capacitance of the equivalent capacitance circuit with a capacitance value equivalent to the capacitance component of the joining machine unit before bonding; and
   a judgment unit that judges the connection state between the wire and the subject device based on a digital output of the capacitance comparison circuit; wherein the capacitance comparison circuit is configured to comprise:
   a differential circuit (68) that generates a differential output signal of the difference between two input signals applied to the input terminals of the differential circuit simultaneously, said two input signals are the responses to the alternating-current signal source of the capacitance component of the joining machine unit (20) after bonding, and the capacitance of said variable equivalent capacitance circuit (64) with a capacitance value equivalent to the capacitance component of the joining machine unit before bonding, respectively;
   an amplifier circuit (70) that amplifies the differential output signal obtained from the differential circuit and thereby outputs amplified signal;
   a rectification circuit (72) that rectifies the amplified signal obtained from the amplifier circuit and thereby outputs rectified signal; and
   an A/D conversion circuit (74) that converts the rectified signal obtained from the rectification circuit (72) to the digital output signal.

2. The bonding apparatus according to claim 1, wherein said variable equivalent capacitance circuit comprises:
   a plurality of capacitance elements; a plurality of switch elements that are interconnected to the plurality of capacitance elements and generate a plurality of capacitance values that are mutually different according to a manner of connection; and
   a switch switching circuit that controls an on/off state of each one of said switch elements and generates said variable capacitance value substantially equivalent to the machine capacitance component.

3. The bonding apparatus according to claim 2, wherein said switch switching circuit switches each one of said switch elements so as to minimize the output of the capacitance comparison circuit when the wire is not in contact with the subject device.

4. The bonding apparatus according to claim 2, wherein each one of said capacitance elements has a capacitance value that is 2-50% of a value of the machine capacitance component, and each one of said switch elements has a capacitance value that is 2-50% of value of the capacitance in the capacitance element having at least capacitance.

5. The bonding apparatus according to claim 1, wherein the judgment unit comprises an averaging processing means that averages the output of the capacitance comparison circuit at a predetermined sampling interval and makes outputs thereof.

6. The bonding apparatus according to claim 5, wherein said judgment unit comprises a judgment processing means that judges the contact state between the wire and the subject device with reference to a predetermined set threshold value in relation to an averaged output.

7. The bonding apparatus according to claim 6, wherein said judgment processing means updates the threshold value in accordance with repetition of joining operations between the wire and the subject device.

8. The bonding apparatus according to claim 6, wherein said judgment processing means sets different threshold values according to a type of subject device.

9. The bonding apparatus according to claim 1, wherein said equivalent circuit comprises:
   a plurality of capacitance elements, a plurality of switch elements that are interconnected to the plurality of capacitance elements and generate a plurality of capacitance values that are mutually different according to a manner of connection, and a switch switching circuit which is a circuit that controls an on/off state of each one of said switch elements and generates said variable capacitance value substantially equivalent to the machine capacitance component, said switch switching circuit switching each one of said switch elements so as to minimize output of the capacitance comparison circuit when the wire is not in contact with the subject device; and
   said judgment processing means sets as a threshold value a value corresponding to the output of the capacitance comparison circuit when the out has been minimized by the switch switching means.

10. The bonding apparatus according to claim 6, wherein said judgment processing means judges whether or not it is possible to detect adhesion/non-adhesion of the subject device.

11. The bonding apparatus according to claim 6, wherein said judgment processing means judges adhesion/non-adhesion between the wire and the subject device.

12. The bonding apparatus according to claim 6, wherein said judgment processing means judges if a length of the wire tail is appropriate or not.

13. The bonding apparatus according to claim 1, wherein said measurement unit further comprises:

a direct-current signal source that supplies a direct-current signal to the joining machine unit in order to measure the connection state between the wire and a subject device has electric conduction with the stage, and a resistance component measurement circuit that measures a resistance component of the joining machine unit when the wire is joined to the subject device; and said measurement unit judges the connection state between the wire and the subject device based on an output of a potential measurement circuit.

14. The bonding apparatus according to claim 13, wherein said measurement unit comprises a measurement switching circuit that switches between measuring the connection state using the capacitance comparison circuit and measuring the connection state using the resistance component measurement circuit.

15. The bonding apparatus according to claim 1, wherein said joining machine unit includes a torch that rounds a tip of the wire; said machine capacitance component includes a capacitance component of the torch; and said bonding apparatus further includes a torch switching circuit that switches a connection with the torch either to the measurement unit or to a high-voltage power supply connected to the torch.

16. The bonding apparatus according to claim 13, wherein said joining machine unit includes a torch that rounds a tip of the wire; said machine capacitance component includes a capacitance component of the torch; and said bonding apparatus further includes a torch switching circuit that switches a connection with the torch either to the measurement unit or to a high-voltage power supply connected to the torch.

17. The bonding apparatus according to claim 2, further comprising said plurality of capacitance elements being selected from the group consisting of 0 pF, 10 pF, 20 pF, 30 pF, 40 pF, 50 pF, 60 pF and 70 pF.

18. The bonding apparatus according to claim 4, further comprising said plurality of capacitance elements being selected from the group consisting of 0 pF, 10 pF, 20 pF, 30 pF, 40 pF, 50 pF, 60 pF and 70 pF.

19. The bonding apparatus according to claim 9, further comprising said plurality of capacitance elements being selected from the group consisting of 0 pF, 10 pF, 20 pF, 30 pF, 40 pF, 50 pF, 60 pF and 70 pF.

* * * * *